United States Patent
Li et al.

(10) Patent No.: US 7,891,091 B2
(45) Date of Patent: Feb. 22, 2011

(54) METHOD OF ENABLING SELECTIVE AREA PLATING ON A SUBSTRATE

(76) Inventors: Yonggang Li, 343 W. Canary Way, Chandler, AZ (US) 85286; Islam Salama, 4435 E. Cherry Hill Dr., Chandler, AZ (US) 85249

( * ) Notice: Subject to any disclaimer, the term of this patent is extended or adjusted under 35 U.S.C. 154(b) by 121 days.

(21) Appl. No.: 12/315,066

(22) Filed: Nov. 25, 2008

(65) Prior Publication Data
US 2010/0126009 A1 May 27, 2010

(51) Int. Cl.
*H01K 3/10* (2006.01)

(52) U.S. Cl. .............. 29/852; 29/825; 29/830; 29/846; 438/625; 257/758

(58) Field of Classification Search ........... 29/825, 29/830, 846, 852; 438/625; 257/758
See application file for complete search history.

(56) References Cited

U.S. PATENT DOCUMENTS

| | | | | |
|---|---|---|---|---|
| 5,729,897 | A * | 3/1998 | Schmidt et al. | 29/852 |
| 6,838,772 | B2 * | 1/2005 | Saitoh et al. | 257/758 |
| 7,033,648 | B1 | 4/2006 | Doany et al. | |
| 7,253,105 | B2 * | 8/2007 | Dimitrakopoulos et al. | 438/674 |
| 7,294,393 | B2 * | 11/2007 | Murai et al. | 428/306.6 |
| 7,339,118 | B1 * | 3/2008 | Takada et al. | 174/255 |
| 2003/0214043 | A1 * | 11/2003 | Saitoh et al. | 257/758 |
| 2005/0144781 | A1 * | 7/2005 | Silverbrook | 29/890.1 |
| 2006/0022341 | A1 * | 2/2006 | Sir et al. | 257/758 |
| 2006/0183309 | A1 | 8/2006 | Asscher et al. | |
| 2006/0189133 | A1 * | 8/2006 | Dimitrakopoulos et al. | 438/687 |
| 2009/0107702 | A1 * | 4/2009 | Samejima et al. | 174/254 |
| 2009/0314525 | A1 * | 12/2009 | Kajino et al. | 174/255 |

FOREIGN PATENT DOCUMENTS

| | | |
|---|---|---|
| KR | 10-2002-65771 A | 5/2003 |
| KR | 10-2003-99910 A | 7/2005 |
| WO | 2010/065301 A2 | 6/2010 |

OTHER PUBLICATIONS

International Search Report and Written Opinion received for PCT Patent Application No. PCT/US2009/064898, mailed on Jun. 4, 2010, pp. 11.
Kim, Jeong-Hoon, et al., "Deposition of stable hydrophobic coating with in-line CH4 atmospheric rf plasma", www.rsc.org/materials, Journal of Materials Chemistry, The Royal Society of Chemistry 2006, First published as an Advance Article on the web Jan. 11, 2006, pp. 977-981.
Bchir, Omar J., et al., "Method of Enabling Selective Area Plating on a Substrate", U.S. Appl. No. 11/861,302, filed Sep. 26, 2007.
Bchir, Omar J., et al., "Method of Removing Unwanted Plated or Conductive Material from a Substrate, and Method of Enabling Metallization of a Substrate using same", U.S. Appl. No. 11/838,057, filed Aug. 13, 2007.

* cited by examiner

*Primary Examiner*—C. J Arbes

(57) ABSTRACT

A method of enabling selective area plating on a substrate (201) includes forming a first electrically conductive layer (310) on the substrate, covering the electrically conductive layer with an anti-electroless plating layer (410), patterning the substrate in order to form therein a feature (510, 520) extending through the anti-electroless plating layer and the first electrically conductive layer, forming a second electrically conductive layer (610) adjoining and electrically connected to the first electrically conductive layer, forming a third electrically conductive layer (710) over the second electrically conductive layer, and removing the anti-electroless plating layer and the first electrically conductive layer.

20 Claims, 3 Drawing Sheets

METHOD OF ENABLING SELECTIVE AREA PLATING ON A SUBSTRATE

FIELD OF THE INVENTION

The disclosed embodiments of the invention relate generally to feature formation in microelectronic devices, and relate more particularly to selective area plating for embedded feature metallization in such devices.

BACKGROUND OF THE INVENTION

The creation of microelectronic devices typically requires the formation of traces or other features in the build-up layers of a substrate. Laser projection patterning (LPP), which uses laser ablation to form such features, is one patterning technique that offers advantages for microelectronic applications. Many other patterning techniques also are used. After trenches and vias are ablated or otherwise formed they must be filled with an electrically conductive material such as copper in order to create electrical interconnects in the substrate.

BRIEF DESCRIPTION OF THE DRAWINGS

The disclosed embodiments will be better understood from a reading of the following detailed description, taken in conjunction with the accompanying figures in the drawings in which.

Figure 1:
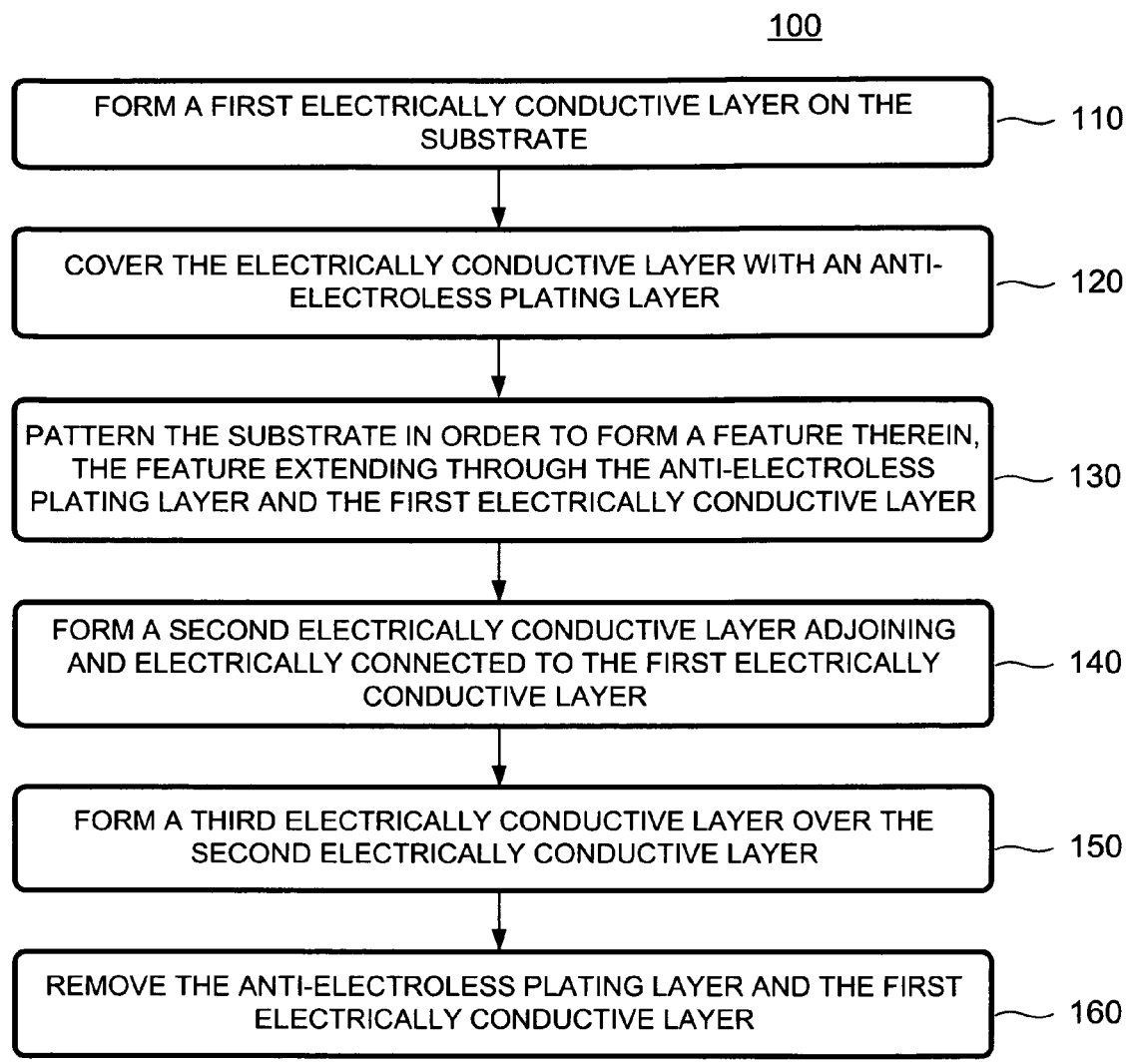
FIG. 1 is a flowchart illustrating a method of enabling selective area plating on a substrate according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of enabling selective area plating on a substrate comprises forming a first electrically conductive layer on the substrate, covering the electrically conductive layer with an anti-electroless plating layer, patterning the substrate in order to form therein a feature extending through the anti-electroless plating layer and the first electrically conductive layer, forming a second electrically conductive layer adjoining and electrically connected to the first electrically conductive layer, forming a third electrically conductive layer over the second electrically conductive layer, and removing the anti-electroless plating layer and the first electrically conductive layer. The anti-electroless plating layer, which for example can be a polymer or a ceramic material, is non-electrically conductive and prevents electroless metal plating, as described below.

Filling the trenches and vias using standard damascene techniques that combine electroless and electrolytic plating processes requires some degree of overplating above the dielectric surface in order to ensure adequate filling of all traces and vias on the substrate. The overplated electrically conductive material must then be removed from the substrate in order to electrically isolate the traces and vias from each other. The overplated material could be removed using chemical mechanical polishing (CMP), which is a standard process for removal of overplated copper in the silicon die fabrication process. However, the use of CMP for substrate manufacture is technically challenging due to manufacturing geometry and poor structural rigidity and dimensional stability. Furthermore, CMP and other post-plating metal removal processes tend to yield non-uniform metal thickness over substrate panel sizes, often resulting in electronic open/short yield loss due to excessive or insufficient plated metal removal, and may cause scratching of the dielectric layer and other problems that raise reliability concerns. Dealing with these and other issues generally makes CMP cost prohibitive for manufacturing organic substrates. Alternative smoothing techniques, such as mechanical grinding or polishing (either alone or in combination with chemical etching), are subject to the aforementioned issues to an even greater degree than is CMP.

Embodiments of the invention, described below, enable substrate metallization using selective area plating without the reliability concerns caused by CMP (or existing alternative techniques). The disclosed methods are easily implemented and may provide a lower-cost route to substrate metallization than CMP (or existing alternative techniques), which requires significant infrastructure investment at the substrate factories.

More specifically, embodiments of the invention enable an embedded pattern to be filled with metal by electrolytic plating. No metal plating takes place on portions of the dielectric surface where no pattern is formed. This metallization process with area-selectivity eliminates the need for any metal removal process such as mechanical polishing and/or chemical etching or the like. The embedded pattern can be formed by methods such as direct laser ablation, including LPP, lithography in photo-definable dielectrics, or the like. The process may enable fine line and space (FLS) formation and may extend the use of organic substrates without the need for planarization. It can also extend to applications in integrated circuits and semiconductor materials.

Referring now to the drawings, FIG. 1 is a flowchart illustrating a method 100 of enabling selective area plating on a substrate according to an embodiment of the invention.

Figure 2:
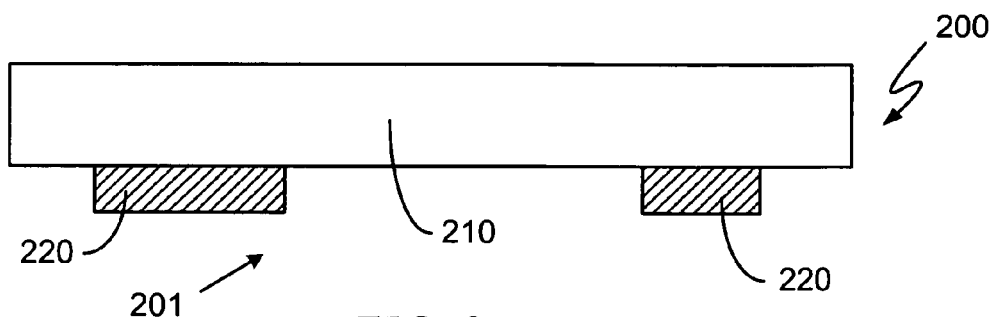
FIGS. 2-8 are cross-sectional views of a portion of a work piece at various particular points in a manufacturing process according to a first embodiment of the invention.

A step 110 of method 100 is to form a first electrically conductive layer on the substrate, as depicted in FIG. 2, which is a cross-sectional view of a portion of a work piece 200 at a particular point in a manufacturing process according to an embodiment of the invention. Work piece 200 comprises build-up layers 210 and pads 220 under build-up layers 210 that together form part of a substrate 201. As an example, pads 220 can comprise copper (or the like) such as is frequently used for substrate metallization. As another example, the substrate referred to in step 110 of method 100 can be similar to substrate 201. It should be understood that substrate 201 may be part of a larger panel containing many substrates, according to a typical manufacturing technique, even though the figures depict, and the text describes, a single substrate representing only a portion of that panel.

Figure 3:
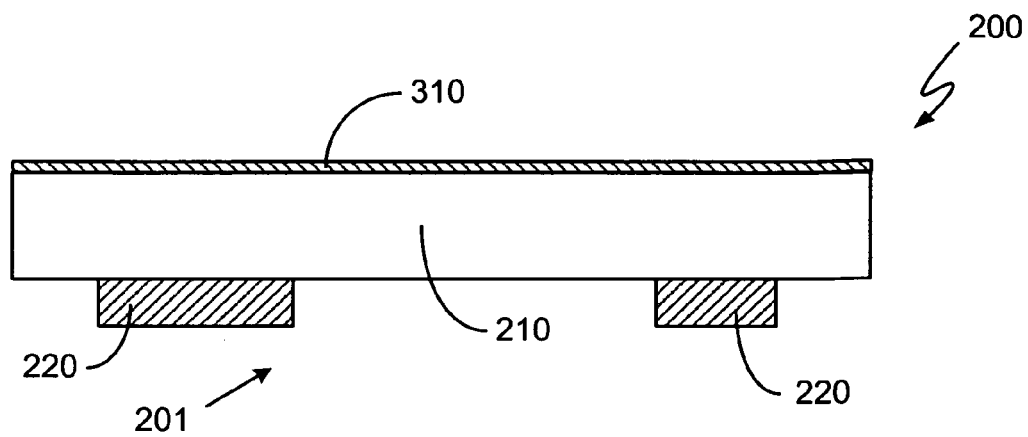

FIG. 3 is a cross-sectional view of a portion of work piece 200 at a particular point in a manufacturing process according to an embodiment of the invention. As an example, FIG. 3 may depict work piece 200 following the performance of step 110 of method 100. As illustrated in FIG. 3, an electrically conductive layer 310 has been formed over substrate 201. As an example, the electrically conductive layer referred to in step 110 of method 100 can be similar to electrically conductive layer 310. In one embodiment, electrically conductive layer 310 is a metal layer formed using an electroless plating process. Copper is often used as the metal in this metal layer but any suitable metal or other electrically conductive material may be used. In one embodiment, electrically conductive layer 310 has a thickness that is between approximately 0.1 micrometers and approximately 1.0 micrometers. (The word "micrometers" will hereinafter be abbreviated as "microns" or "µm").

Figure 4:
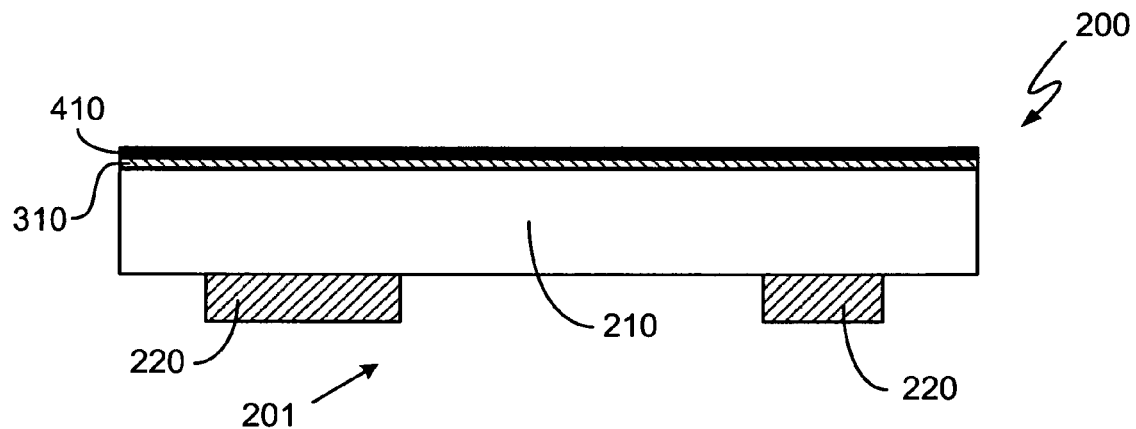

A step 120 of method 100 is to cover the electrically conductive layer with an anti-electroless plating layer. FIG. 4 is a cross-sectional view of a portion of work piece 200 at a particular point in a manufacturing process according to an embodiment of the invention. As an example, FIG. 4 may depict work piece 200 following the performance of step 120 of method 100. As illustrated in FIG. 4, an anti-electroless plating layer 410 has been formed over electrically conductive layer 310. As an example, the anti-electroless plating layer referred to in step 120 of method 100 can be similar to anti-electroless plating layer 410.

In one embodiment, anti-electroless plating layer 410 comprises a photosensitive solder resist film that is sensitive to a particular portion of the electromagnetic spectrum. As an example, the photosensitive solder resist film may be formed from liquid solder resist or dry film precursor. The liquid solder resist can be applied to the electrically conductive layer using roller coating, screen printing, spin coating, spray coating, or another suitable technique as known in the art. Spin coating, for example, may represent a particularly easy way to apply a layer of the photosensitive solder resist film in the thicknesses desired. In at least one embodiment, such desired thicknesses are approximately 2-3 µm. The liquid film thus formed is then cured and set by heating, by exposure to radiation from the particular portion of the electromagnetic spectrum to which the solder resist is sensitive, or by a combination of heating and exposure. The dry film type of solder resist comes partially cured and can simply be laminated on top of the first electrically conductive layer, followed with heating or exposure (or both) in order to fully cure.

As an example, the solder resist film can be conventional solder resists that are frequently used in mass production of semiconductor packages. These solder resists may include blended filler materials for thermal/mechanical property tuning. Simplified formulations in which very few or no such fillers are incorporated may also be used. The solder resist can be coated as a very thin film, e.g., a film of 2 µm or less. The film is immune to electroless metal plating: materials formed by electroless plating processes do not form over the solder resist film.

In another embodiment, anti-electroless plating layer 410 comprises a hydrophobic polymer layer such as polydimethylsiloxane (PDMS), polyethylene (PE), poly(tetrafluoroethylene) (PTFE), or the like. As an example, the hydrophobic polymer layer may be laminated in film form or coated in liquid form using one of the methods mentioned above, i.e., roller coating, screen printing, spin coating, spray coating, or another suitable technique as known in the art.

In still another embodiment, anti-electroless plating layer 410 comprises a hydrophobic hydrocarbon film. In this embodiment, step 120 of method 100 can comprise using a plasma polymerization process to deposit the hydrophobic hydrocarbon film on electrically conductive layer 310. As an example, the process may comprise a $CH_4$ plasma polymerization deposition. This may be conducted with an in-line atmospheric RF plasma process in which an atmospheric RF glow discharge plasma is generated over a relatively large area (perhaps tens of square centimeters) with a rectangular electrode. Hydrophobic coating layers may be produced by plasma polymerization of $CH_4$. The substrate may be continuously translated under the plasma deposition region. The thickness of the hydrocarbon film thus produced may vary from a few tens to some hundreds of nanometers depending on the dwell time (the time during which the substrate is subjected to plasma deposition). The hydrocarbon coating tends to be very stable and durable, with no noticeable degradation of hydrophobicity even when exposed in air for several months. The plasma-deposited coatings remain intact even in organic solvents such as hexane and retain the hydrophobicity after the solvent is dried completely.

A step 130 of method 100 is to pattern the substrate in order to form a feature therein, the feature extending through the anti-electroless plating layer and the first electrically conductive layer. In one embodiment, step 130 may comprise forming a via in the substrate, perhaps by laser drilling or other methods such as plasma etching and the like, and may further comprise forming an embedded trace pattern in the substrate, such as by LPP, in which a high power laser beam is projected onto the dielectric through a mask, direct laser writing, in which a focused laser beam scribes the dielectric to form a pattern without using a mask, or the like. The electrically conductive layer and the anti-electroless plating layer do not greatly impact the laser ablation process as the total thickness of the two layers is typically less than 10 μm (in one embodiment, less than 3 μm) which takes very few added laser pulses to ablate. In one embodiment, the dielectric is then cleaned either by wet chemical solution such as a desmear solution, or a dry cleaning process such as plasma cleaning.

Figure 5:
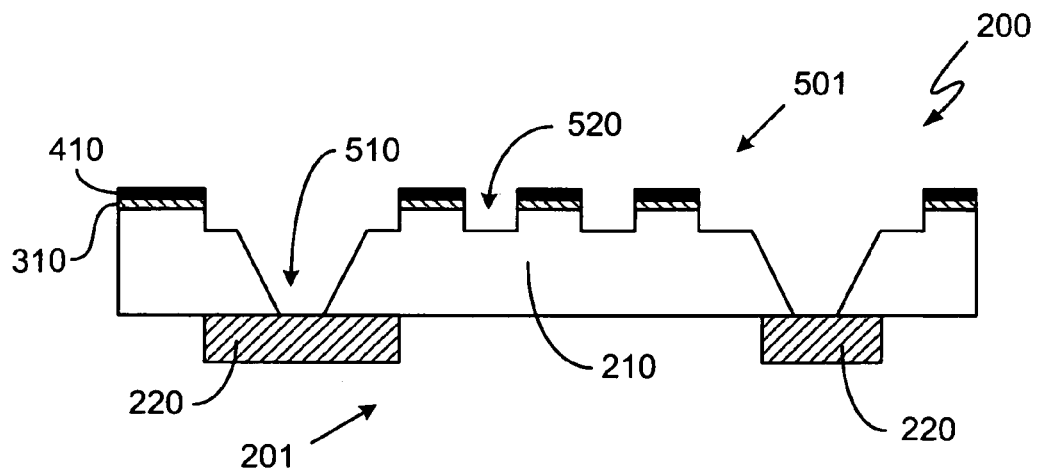

FIG. 5 is a cross-sectional view of a portion of work piece 200 at a particular point in a manufacturing process according to an embodiment of the invention. As an example, FIG. 5 may depict work piece 200 following the performance of step 130 of method 100. As illustrated in FIG. 5, substrate 201 has been patterned in order to form a pattern 501 therein. As shown, pattern 501 comprises vias 510 and trace pattern 520. As an example, either of vias 510 and trace pattern 520, or both together, can constitute the feature referred to in step 130 of method 100.

A step 140 of method 100 is to form a second electrically conductive layer adjoining and electrically connected to the first electrically conductive layer. In one embodiment, step 140 comprises forming a metal layer using an electroless plating process, similar to what may be done to form the first electrically conductive layer as described above in connection with step 110. The composition and thickness of the second electrically conductive layer may be very similar to the composition and thickness of the first electrically conductive layer. Accordingly, the second electrically conductive layer, like the first, may in one embodiment be an electroless copper layer having a thickness that is between approximately 0.1 μm and approximately 1.0 μm. In fact, following the performance of step 140 the first and second electrically conductive layers may become largely indistinguishable from each other, as shown in FIG. 6.

Figure 6:
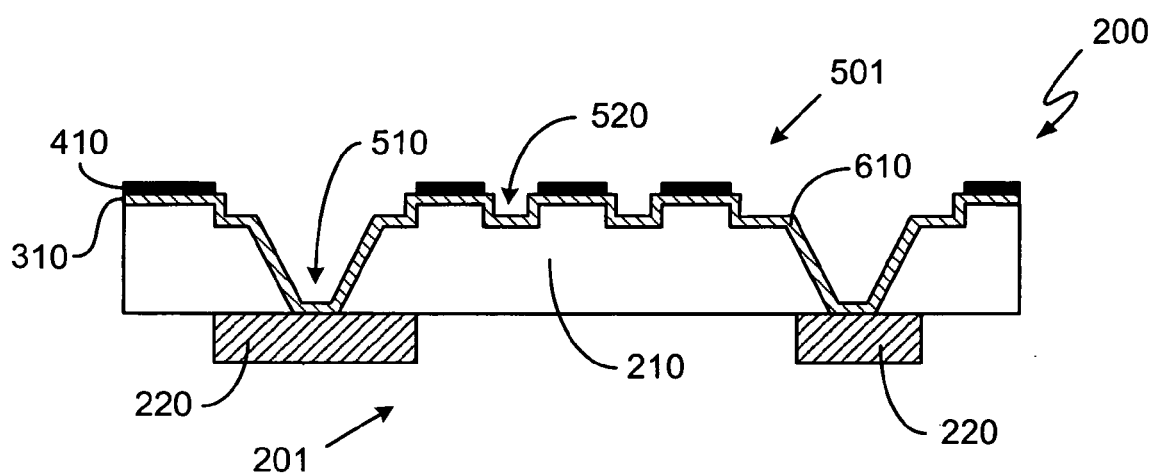

FIG. 6 is a cross-sectional view of a portion of work piece 200 at a particular point in a manufacturing process according to an embodiment of the invention. As an example, FIG. 6 may depict work piece 200 following the performance of step 140 of method 100. As illustrated in FIG. 6, an electrically conductive layer 610 has been formed such that it adjoins and is electrically connected to electrically conductive layer 310. As an example, the second electrically conductive layer that is referred to in step 140 of method 100 can be similar to electrically conductive layer 610. Note that, as mentioned above, electrically conductive layers 610 and 310 are practically indistinguishable from each other and have become essentially a single electrically conductive layer extending across substantially all of an upper surface of substrate 201. (The two electrically conductive layers may be differentiated, however, by remembering that electrically conductive layer 310 is covered by anti-electroless plating layer 410.) Note further that electrically conductive layer 610 is formed only on areas not covered by anti-electroless plating layer 410. (The anti-electroless plating layer prevents an electroless plating metal layer from forming on top of it.) These areas make up pattern 501 and represent the features formed by laser ablation or a similar patterning procedure, i.e., the embedded areas.

A step 150 of method 100 is to form a third electrically conductive layer over the second electrically conductive layer. In one embodiment, step 150 comprises filling vias 510 and trace pattern 520 with copper (or another suitable electrically conductive material) using an electrolytic plating process. The metal fills only the embedded areas, as the balance of the substrate is covered with the anti-electroless plating layer. Vias 510 and trace pattern 520 can be filled simultaneously using a filled via plating solution that is widely used in high density interconnect (HDI) substrate production.

Figure 7:
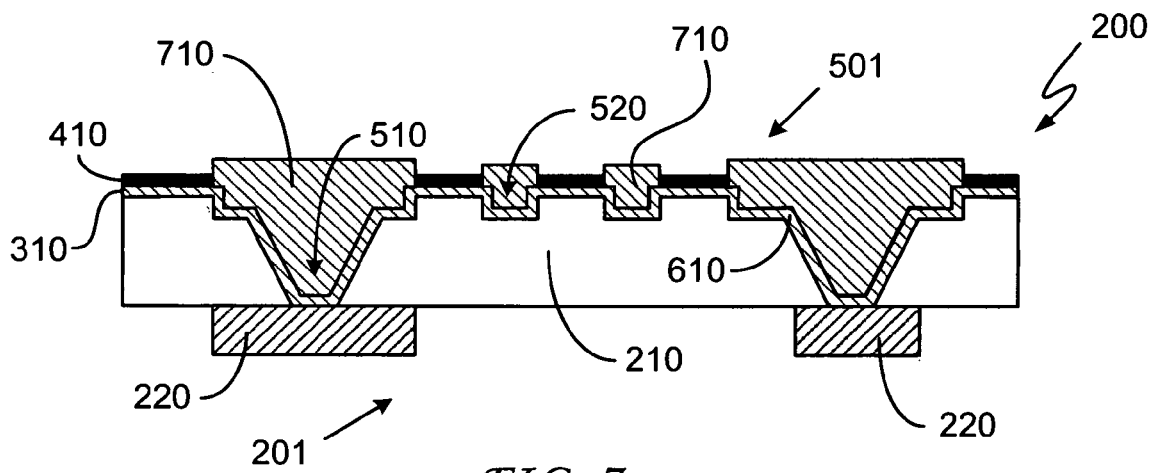

FIG. 7 is a cross-sectional view of a portion of work piece 200 at a particular point in a manufacturing process according to an embodiment of the invention. As an example, FIG. 7 may depict work piece 200 following the performance of step 150 of method 100. As illustrated in FIG. 7, an electrically conductive layer 710 has been formed over electrically conductive layer 610. As an example, the third electrically conductive layer referred to in step 150 of method 100 can be similar to electrically conductive layer 710.

A step 160 of method 100 is to remove the anti-electroless plating layer and the first electrically conductive layer. This electrically isolates the pattern features. In one embodiment, removing the first electrically conductive layer comprises chemically etching away the first electrically conductive layer using a sulfuric acid based solution. In the same or another embodiment, the anti-electroless plating layer may be removed by plasma etching or by using a chemical solution such as an aqueous permanganate solution. In one embodiment, a single step or process (e.g., a reactive ion etch) may be used to remove both the anti-electroless plating layer and the first electrically conductive layer. In another embodiment, the anti-electroless plating layer is removed in a first process and the first electrically conductive layer is subsequently removed in a second process, such as a quick-etch process.

As mentioned above, the anti-electroless plating layer may be removed either by a chemical solution or by plasma etching, the composition of which depends on the material used for the anti-electroless plating layer. As an example, $O_2$ plasma or $CH_4$ plasma, or a combination of the two, is a very versatile solution for anti-electroless plating layer removal. PDMS can be removed chemically using a two step process comprising swelling and etching. The swelling solvents can be chloroform and ether for PDMS, and the etching solution can be an aqueous permanganate solution. PE can be removed thermally, as the melting point of PE (which varies with molecular weight but is lower than 130° Celsius) is much lower than that of the epoxy-based dielectrics found in substrate 201.

Figure 8:
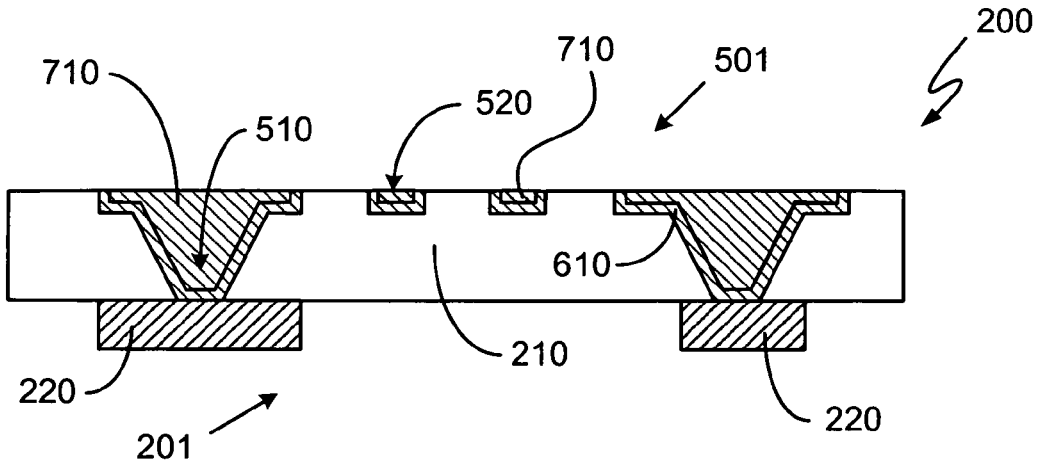

FIG. 8 is a cross-sectional view of a portion of work piece 200 at a particular point in a manufacturing process according to an embodiment of the invention. As an example, FIG. 8 may depict work piece 200 following the performance of step 160 of method 100. As illustrated in FIG. 8, anti-electroless plating layer 410 and electrically conductive layer 310 have been removed, leaving electrically conductive layers 610 and 710 in vias 510 and trace patterns 520. Note that the quick-etch procedure removes an upper portion of electrically conductive layers 610 and 710 as well. However, the amount removed is minimal and does not negatively affect the performance of those layers.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the methods of enabling selective area plating discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of enabling selective area plating on a substrate, the method comprising:
   forming a first electrically conductive layer on the substrate;
   covering the first electrically conductive layer with a solder resist layer;
   patterning the substrate in order to form a feature therein, the feature extending through the solder resist layer and the first electrically conductive layer;
   forming a second electrically conductive layer adjoining and electrically connected to the first electrically conductive layer;
   forming a third electrically conductive layer over the second electrically conductive layer; and
   removing the solder resist layer and the first electrically conductive layer.

2. The method of claim 1 wherein:
   forming the first electrically conductive layer comprises forming a first copper layer using a first electroless plating process;
   forming the second electrically conductive layer comprises forming a second copper layer using a second electroless plating process;
   the first copper layer has a first thickness that is between approximately 0.1 microns and approximately 1.0 microns; and
   the second copper layer has a second thickness that is approximately equal to the first thickness.

3. The method of claim 1 wherein:
   covering the first electrically conductive layer with the solder resist layer comprises coating a photosensitive solder resist film onto the first electrically conductive layer, the photosensitive solder resist film being sensitive to an electromagnetic wavelength; and
   uniformly exposing the photosensitive solder resist film to the electromagnetic wavelength.

4. The method of claim 3 wherein:
   coating the photosensitive solder resist film onto the first electrically conductive layer comprises an operation selected from the group consisting of roller coating, screen printing, spin coating, and spray coating.

5. The method of claim 1 wherein:
   patterning the substrate in order to form the feature therein comprises forming a via in the substrate.

6. The method of claim 5 wherein:
   patterning the substrate in order to form the feature therein further comprises forming an embedded trace pattern in the substrate.

7. The method of claim 1 wherein:
   forming the third electrically conductive layer comprises filling the feature with copper using an electrolytic plating process.

8. The method of claim 1 wherein:
   removing the first electrically conductive layer comprises chemically etching away the first electrically conductive layer using a sulfuric acid based solution.

9. A method of enabling selective area plating on a substrate, the method comprising:
   forming a first electrically conductive layer on the substrate;
   covering the first electrically conductive layer with a hydrophobic polymer layer;
   patterning the substrate in order to form a feature therein, the feature extending through the hydrophobic polymer layer and the first electrically conductive layer;
   forming a second electrically conductive layer adjoining and electrically connected to the first electrically conductive layer;
   forming a third electrically conductive layer over the second electrically conductive layer; and
   removing the hydrophobic polymer layer and the first electrically conductive layer.

10. The method of claim 9 wherein:
    covering the first electrically conductive layer with the hydrophobic polymer layer comprises applying a polymer material selected from the group consisting of PDMS, PE, and PTFE.

11. The method of claim 9 wherein:
    forming the first electrically conductive layer comprises forming a first copper layer using a first electroless plating process;
    forming the second electrically conductive layer comprises forming a second copper layer using a second electroless plating process;
    the first copper layer has a first thickness that is between approximately 0.1 microns and approximately 1.0 microns; and
    the second copper layer has a second thickness that is approximately equal to the first thickness.

12. The method of claim 11 wherein:
    patterning the substrate in order to form the feature therein comprises forming a via in the substrate.

13. The method of claim 12 wherein:
    patterning the substrate in order to form the feature therein further comprises forming an embedded trace pattern in the substrate.

14. The method of claim 13 wherein:
    forming the third electrically conductive layer comprises filling the feature with copper using an electrolytic plating process.

15. The method of claim 14 wherein:
    removing the first electrically conductive layer comprises chemically etching away the first electrically conductive layer using a sulfuric acid based solution.

16. A method of enabling selective area plating on a substrate, the method comprising:
    forming a first electrically conductive layer on the substrate;
    using a plasma polymerization process to deposit a hydrophobic hydrocarbon film on the first electrically conductive layer;
    patterning the substrate in order to form a feature therein, the feature extending through the hydrophobic hydrocarbon film and the first electrically conductive layer;
    forming a second electrically conductive layer adjoining and electrically connected to the first electrically conductive layer;
    forming a third electrically conductive layer over the second electrically conductive layer; and
    removing the hydrophobic hydrocarbon film and the first electrically conductive layer.

17. The method of claim 16 wherein:

forming the first electrically conductive layer comprises forming a first copper layer using a first electroless plating process;

forming the second electrically conductive layer comprises forming a second copper layer using a second electroless plating process;

the first copper layer has a first thickness that is between approximately 0.1 microns and approximately 1.0 microns; and the second copper layer has a second thickness that is approximately equal to the first thickness.

18. The method of claim 16 wherein:

patterning the substrate in order to form the feature therein comprises forming a via in the substrate and further comprises forming an embedded trace pattern in the substrate.

19. The method of claim 16 wherein:

forming the third electrically conductive layer comprises filling the feature with copper using an electrolytic plating process.

20. The method of claim 16 wherein:

removing the first electrically conductive layer comprises chemically etching away the first electrically conductive layer using a sulfuric acid based solution.

* * * * *